United States Patent
Moriyama

(10) Patent No.: US 9,653,371 B2
(45) Date of Patent: May 16, 2017

(54) UNDERFILL MATERIAL AND METHOD FOR MANUFACTURING SEMICONDUCTOR DEVICE USING THE SAME

(71) Applicant: DEXERIALS CORPORATION, Tokyo (JP)

(72) Inventor: Hironobu Moriyama, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/423,881

(22) PCT Filed: Sep. 10, 2014

(86) PCT No.: PCT/JP2014/073965
§ 371 (c)(1),
(2) Date: Feb. 25, 2015

(87) PCT Pub. No.: WO2015/045877
PCT Pub. Date: Apr. 2, 2015

(65) Prior Publication Data
US 2015/0348859 A1    Dec. 3, 2015

(30) Foreign Application Priority Data

Sep. 27, 2013    (JP) .................................. 2013-201613

(51) Int. Cl.
*H01L 23/29*    (2006.01)
*C08G 59/18*    (2006.01)
(Continued)

(52) U.S. Cl.
CPC ............ *H01L 23/293* (2013.01); *C08G 59/18* (2013.01); *C08G 59/24* (2013.01);
(Continued)

(58) Field of Classification Search
CPC ......... H01L 23/29; H01L 23/00; H01L 21/56; H01L 23/3735; H01L 23/485; H01L 23/488; H01L 23/49513
(Continued)

(56) References Cited

U.S. PATENT DOCUMENTS

| | | | |
|---|---|---|---|
| 2005/0008873 A1* | 1/2005 | Noro ....................... | B32B 27/08 428/423.1 |
| 2009/0166897 A1* | 7/2009 | Katsurayama et al. ...... | 257/793 |
| 2012/0248632 A1* | 10/2012 | Mitsukura .............. | C09J 7/0203 257/787 |

FOREIGN PATENT DOCUMENTS

| | | |
|---|---|---|
| JP | 2005-028734 A | 2/2005 |
| JP | 2007-116079 A | 5/2007 |

(Continued)

OTHER PUBLICATIONS

Nov. 11, 2014 International Search Report issued in International Patent Application No. PCT/JP2014/073965.

*Primary Examiner* — Chuong A Luu
*Assistant Examiner* — Rodolfo D Fortich
(74) *Attorney, Agent, or Firm* — Oliff PLC

(57) ABSTRACT

An underfill material enabling voidless packaging and excellent solder bonding properties, and a method for manufacturing a semiconductor device using the same are provided. An underfill material is used which contains an epoxy resin and a curing agent, and a time for a reaction rate to reach 20% at 240° C. calculated by Ozawa method using a differential scanning calorimeter is 2.0 sec or less and a time for the reaction rate to reach 60% is 3.0 sec or more. This enables voidless packaging and excellent solder connection properties.

5 Claims, 6 Drawing Sheets

(51) Int. Cl.
  *H01L 21/56* (2006.01)
  *H01L 23/00* (2006.01)
  *H01L 21/683* (2006.01)
  *H01L 25/065* (2006.01)
  *H01L 25/00* (2006.01)
  *C08G 59/24* (2006.01)
  *C08G 59/42* (2006.01)
  *C08G 59/68* (2006.01)
  *C08L 63/00* (2006.01)

(52) U.S. Cl.
  CPC ....... *C08G 59/4207* (2013.01); *C08G 59/686* (2013.01); *C08L 63/00* (2013.01); *H01L 21/563* (2013.01); *H01L 21/6836* (2013.01); *H01L 24/13* (2013.01); *H01L 24/27* (2013.01); *H01L 24/29* (2013.01); *H01L 24/81* (2013.01); *H01L 24/83* (2013.01); *H01L 24/92* (2013.01); *H01L 24/94* (2013.01); *H01L 25/0657* (2013.01); *H01L 25/50* (2013.01); *H01L 24/16* (2013.01); *H01L 24/32* (2013.01); *H01L 24/73* (2013.01); *H01L 24/75* (2013.01); *H01L 2221/6834* (2013.01); *H01L 2221/68327* (2013.01); *H01L 2221/68377* (2013.01); *H01L 2224/13023* (2013.01); *H01L 2224/13111* (2013.01); *H01L 2224/13147* (2013.01); *H01L 2224/16145* (2013.01); *H01L 2224/16225* (2013.01); *H01L 2224/16227* (2013.01); *H01L 2224/16238* (2013.01); *H01L 2224/271* (2013.01); *H01L 2224/27003* (2013.01); *H01L 2224/2919* (2013.01); *H01L 2224/2929* (2013.01); *H01L 2224/2939* (2013.01); *H01L 2224/29387* (2013.01); *H01L 2224/32145* (2013.01); *H01L 2224/32225* (2013.01); *H01L 2224/73104* (2013.01); *H01L 2224/73204* (2013.01); *H01L 2224/75301* (2013.01); *H01L 2224/75702* (2013.01); *H01L 2224/81011* (2013.01); *H01L 2224/81191* (2013.01); *H01L 2224/81193* (2013.01); *H01L 2224/81203* (2013.01); *H01L 2224/81204* (2013.01); *H01L 2224/81815* (2013.01); *H01L 2224/81907* (2013.01); *H01L 2224/83191* (2013.01); *H01L 2224/83204* (2013.01); *H01L 2224/83862* (2013.01); *H01L 2224/83907* (2013.01); *H01L 2224/92* (2013.01); *H01L 2224/921* (2013.01); *H01L 2224/9205* (2013.01); *H01L 2224/9211* (2013.01); *H01L 2224/94* (2013.01); *H01L 2225/06513* (2013.01); *H01L 2225/06541* (2013.01); *H01L 2924/06* (2013.01); *H01L 2924/0635* (2013.01); *H01L 2924/0665* (2013.01); *H01L 2924/186* (2013.01); *H01L 2924/20102* (2013.01); *H01L 2924/20103* (2013.01); *H01L 2924/20104* (2013.01)

(58) Field of Classification Search
  USPC .................. 438/126, 460, 124, 125, 127
  See application file for complete search history.

(56) References Cited

FOREIGN PATENT DOCUMENTS

| | | |
|---|---|---|
| JP | 2010-010669 A | 1/2010 |
| JP | 2013-123033 A | 6/2013 |
| JP | 2013-183000 A | 9/2013 |

* cited by examiner

UNDERFILL MATERIAL AND METHOD FOR MANUFACTURING SEMICONDUCTOR DEVICE USING THE SAME

TECHNICAL FIELD

This invention relates to an underfill material used for packaging a semiconductor chip and a method for manufacturing a semiconductor device using the same. This application claims priority to Japanese Patent Application No. 2013-201613, filed on Sep. 27, 2013, the entire content of which is incorporated herein by reference.

BACKGROUND ART

In recent years, with an object of shortening processes related to mounting methods of semiconductor chips, the use of pre-applied underfill film (PUF) wherein an underfill film is applied to electrodes of an integrated circuit (IC) has been investigated.

Packaging methods using this pre-applied underfill film are, for example, performed in the following manner (For example, refer to PTL 1).

Step A: An underfill film is applied to a wafer and the wafer is diced to obtain a semiconductor chip(s).

Step B: The semiconductor chip is aligned on the substrate after the application of the underfill film.

Step C: The semiconductor chip and substrate are thermally compressed together, electrical conduction is ensured using metallic bonding of solder bumps, and the semiconductor chip is bonded to the substrate by curing of the underfill film.

In such a packaging method, thermosetting adhesives using epoxy resin have been developed as adhesives to bond the solder bumps. In these adhesives, there have been proposed compositions using various curing agents including phenol, acid anhydride and amine type curing agent, among others, as a curing agent for epoxy resin (for example, see PTL 2).

As preventive measures for voids that might occur during thermocompression bonding, voidless packaging can be achieved by using a peroxide, among others, as a curing agent and by increasing curing speed; however, this degrades solder bonding properties.

PRIOR ART LITERATURE

Patent Literature

PTL 1 Japanese Unexamined Patent Publication No. 2005-28734
PTL 2 Japanese Unexamined Patent Publication No. 2010-10669

SUMMARY OF THE INVENTION

Problem to be Solved by the Invention

In view of the foregoing, an object of this invention is to provide an underfill film material and a method for manufacturing a semiconductor device using the same which enables voidless mounting and favorable solder bonding properties.

Means for Solving the Problem

As a result of intensive studies, the inventors of the present invention completed the invention by finding that voidless packaging and excellent solder bonding properties can be achieved when a time to reach a first reaction rate is equal to or less than a predetermined time and a time to reach a second reaction rate, which is higher than the first reaction rate, is equal to or more than a predetermined time.

The present invention provides an underfill material applied to a semiconductor chip having a solder-tipped electrode formed thereon before mounting the semiconductor chip onto an electronic component having a counter electrode facing the solder-tipped electrode, wherein the underfill material contains an epoxy resin and a curing agent, and a time for a reaction rate to reach 20% at 240° C. calculated by Ozawa method using a differential scanning calorimeter is 2.0 sec or less and a time for the reaction rate to reach 60% is 3.0 sec or more.

Additionally, a method for manufacturing a semiconductor device of the present invention includes a mounting step of mounting a semiconductor chip onto an electronic component, the semiconductor chip having a solder-tipped electrode formed thereon and an underfill material applied to the surface of the electrode, and the electronic component having a counter electrode facing the electrode, and a thermocompression bonding step of thermally compressing the semiconductor chip and the electronic component, wherein the underfill material contains an epoxy resin and an acid anhydride, and a time for a reaction rate to reach 20% at 240° C. calculated by Ozawa method using a differential scanning calorimeter is 2.0 sec or less and a time for the reaction rate to reach 60% is 3.0 sec or more.

Effects of the Invention

The underfill material according to the present invention in which a time for the reaction rate to reach 20% at 240° C. is 2.0 sec or less and a time for the reaction rate to reach 60% is 3.0 sec or more can achieve voidless packaging and excellent solder bonding properties.

DESCRIPTION OF THE EMBODIMENTS

Embodiments of the present invention will be described in detail below in the following order.
1. Underfill Material
2. Method for Manufacturing Semiconductor Device
3. Examples 1. Underfill Material An underfill material according to this embodiment is applied to a semiconductor chip, on which a solder-tipped electrode has been formed, before the semiconductor chip is mounted to an electrical component having a counter solder-tipped electrode formed thereon.

Figure 1:
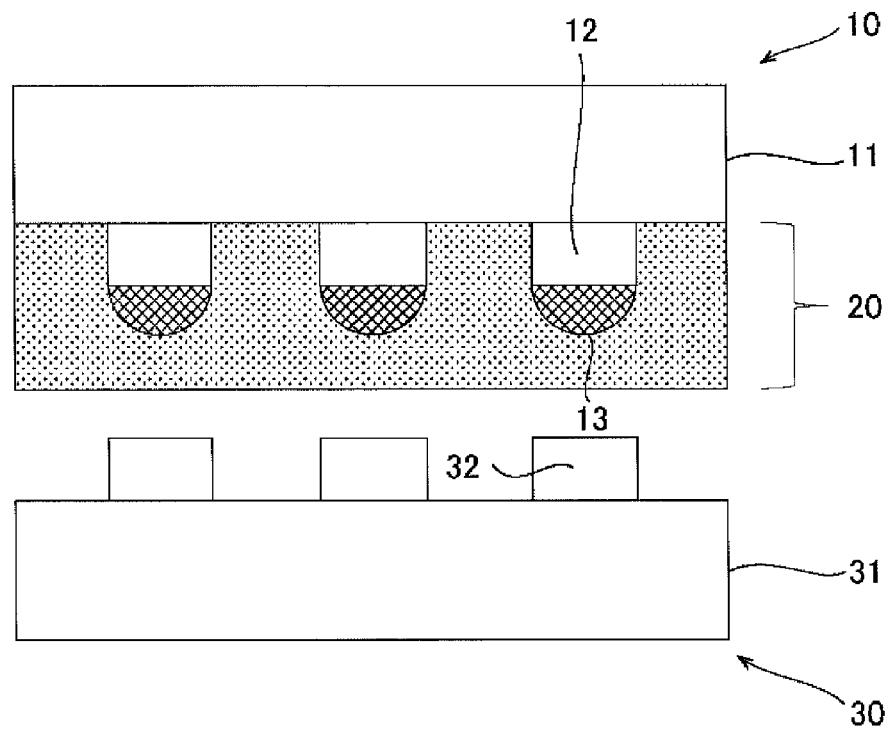
FIG. 1 is a schematic cross-sectional view illustrating a semiconductor chip and a circuit substrate before mounting.
Figure 2:
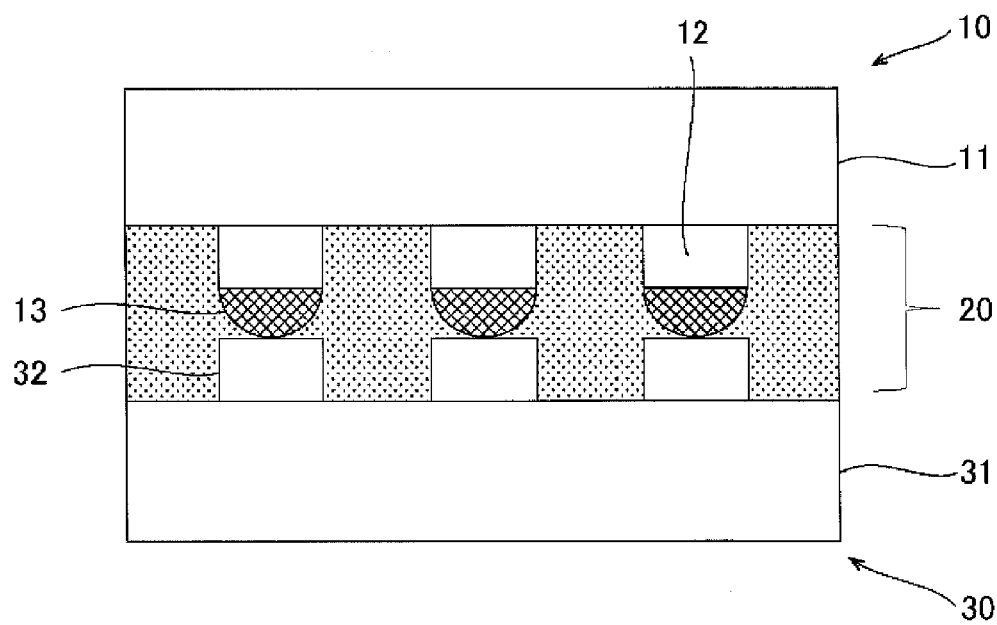
FIG. 2 is a schematic cross-sectional view illustrating the semiconductor chip and the circuit substrate at the time of mounting.
Figure 3:
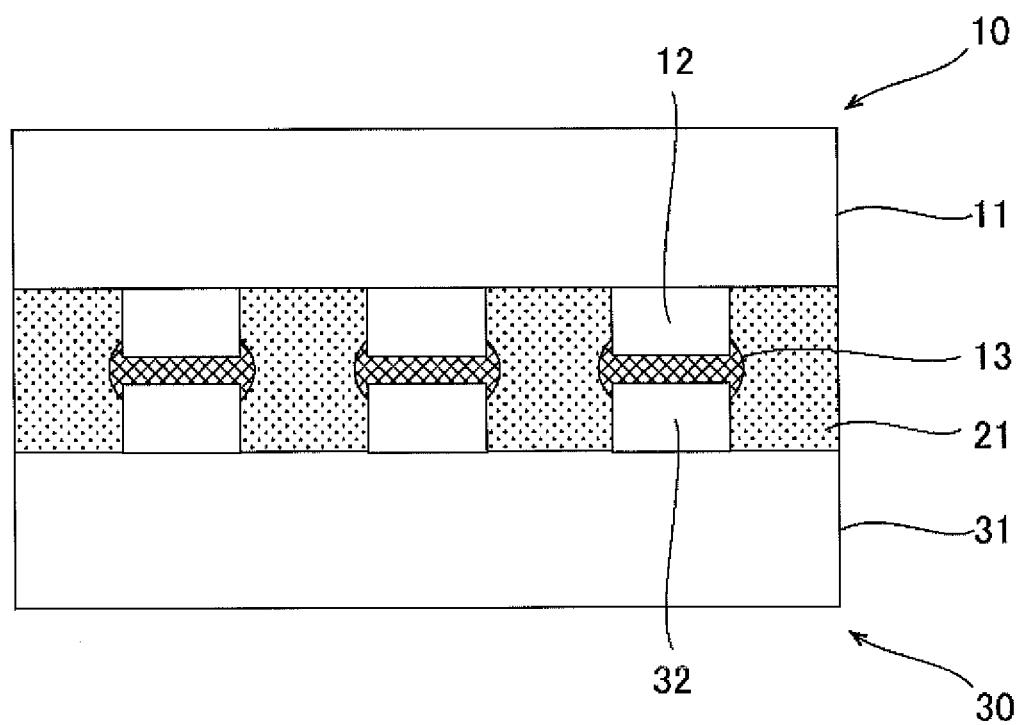
FIG. 3 is a schematic cross-sectional view illustrating the semiconductor chip and the circuit substrate after thermocompression bonding.

FIG. 1 is a cross-sectional schematic view illustrating the semiconductor chip and a circuit substrate before mounting, FIG. 2 is a cross-sectional schematic view of the semiconductor chip and the circuit substrate at the time of mounting, and FIG. 3 is a cross-sectional schematic view of the semiconductor chip and the circuit substrate after thermo-compression bonding.

As illustrated in FIGS. 1 to 3, an underfill material 20 according to this embodiment is applied in advance to the electrode side of the semiconductor chip 10 having a solder-tipped electrode formed thereon, and the semiconductor chip 10 is bonded to the circuit substrate 30, on which a counter electrode facing the solder-tipped electrode has been formed, by the adhesive layer 21 formed of the cured underfill material 20.

The semiconductor chip 10 includes an integrated circuit formed on a surface of a semiconductor 11, which is formed from such materials as silicon, and an electrode with bonding-use solder called bump (referred to as solder-tipped electrode). The solder-tipped electrode includes an electrode 12 formed of copper, for example, to which a solder 13 is bonded, total thickness of the solder-tipped electrode being the combined thickness of the electrode 12 and the solder 13.

As a solder, Sn-37Pb eutectic solder (melting point: 183° C.), Sn—Bi solder (melting point: 139° C.), Sn-3.5Ag (melting point: 221° C.), Sn3.0Ag-0.5Cu (melting point: 217° C.), Sn-5.0Sb (melting point: 240° C.), among others, may be used.

The circuit substrate 30 includes a circuit formed on a substrate material 31, which is for example, a rigid substrate or a flexible substrate, among others. Additionally, a counter electrode 32 of a predetermined thickness is formed in the position(s) corresponding to the electrode(s) of the semiconductor chip on the area on which the semiconductor chip 10 is to be mounted.

The underfill material 20 includes a film-forming resin, an epoxy resin and an acid anhydride. The film-forming resin has a weight-average molecular weight of $10*10^4$ or higher corresponding to a high molecular weight resin, and in view of film forming properties, the weight-average molecular weight is preferably in the range of $10*10^4$ to $100*10^4$. As a film-forming resin, an acrylic rubber polymer, a phenoxy resin, an epoxy resin, a modified epoxy resin, and/or a urethane resin, among a variety of other resins, can be used. These film-forming resins may be used individually or in combinations of two or more. In this embodiment, among these film-forming resins, in view of film-strength properties and adhesive properties, a phenoxy resin and an acrylic rubber polymer having a glycidyl group can preferably be used. Preferably, the glass transition temperature Tg of the acrylic rubber polymer ranges from −30° C. to 20° C. This improves the flexibility of the underfill material 20.

Examples of epoxy resin include, dicyclopentadiene type epoxy resin, glycidylether type epoxy resin, glycidylamine type epoxy resin, bisphenol A type epoxy resin, bisphenol F type epoxy resin, bisphenol S type epoxy resin, Spiro ring type epoxy resin, naphthalene type epoxy resin, biphenyl type epoxy resin, terpene type epoxy resin, tetrabromobisphenol A type epoxy resin, cresol novolak type epoxy resin, phenol novolak type epoxy resin, α-naphthol novolak type epoxy resin, and brominated phenol novolak type epoxy resin. These epoxy resins may be used individually or in a combination of two or more. Among these, dicyclopentadiene type epoxy resin which has a high adhesion property and heat-resisting property, is preferably used in this embodiment.

As a curing agent, well-known curing agents of epoxy compounds can be used, including latent curing agents. Acid anhydride type curing agents, imidazole type curing agents and amine type curing agents may be used, among others.

Acid anhydride can provide excellent connection reliability because its flux function removes oxide film on a solder surface. Examples of acid anhydride include aliphatic acid anhydrides such as tetra propenyl succinic anhydride and dodecenyl succinic anhydride, and alicyclic acid anhydrides such as hexahydro phthalic anhydride and methyl tetrahydro phthalic anhydride, and aromatic acid anhydrides such as phthalic anhydride, trimellitic anhydride and pyromellitic anhydride. These epoxy curing agents may be used individually or in a combination of two or more. Among these, from the viewpoint of solder connectivity, alicyclic acid anhydride is preferably used.

Furthermore, curing accelerator is preferably added. Examples of the curing accelerator include imidazoles such as 2-methylimidazole, 2-ethylimidazole and 2-ethyl-4-methylimidazole, 1,8-diazabicyclo(5,4,0)undecene-7 salts (DBU salt), tertiary amines such as 2-(dimethylaminomethyl)phenol, phosphines such as triphenylphosphine, and metallic compounds such as tin octylate.

The underfill material 20 may further include epoxy resin and acid anhydride. As an acrylic resin, monofunctional (meth)acrylate or polyfunctional (meth)acrylate may be used. Examples of monofunctional (meth)acrylates include methyl (meth)acrylate, ethyl (meth)acrylate, n-propyl (meth)acrylate, i-propyl (meth)acrylate and n-butyl (meth)acrylate. Examples of polyfunctional (meth)acrylate include bisphenol F EO-modified di(meth)acrylate, bisphenol A EO-modified di(meth)acrylate, torimetirorlpropan PO-modified (meth)acrylate and multifunctional urethane (meth)acrylate. These acrylic resins may be used individually or in a combination of two or more. Among these, bifunctional (meth)acrylate is preferably used in this embodiment.

Examples of organic peroxide include, peroxy ester, peroxy ketal, hydroperoxide, dialkyl peroxide, diacyl peroxide and peroxydicarbonate. These organic peroxides may be used individually or in a combination of two or more. Among these, peroxy ester is preferably used in this embodiment.

Furthermore, an inorganic filler is preferably contained as another additive composition. The inorganic filler can regulate the fluidity of resin layers during crimping. As an inorganic filler, silica, talc, titanium oxide, calcium carbonate and magnesium oxide can be used, among others.

Moreover, epoxy-based, amino-based, mercapto-sulfide-based, and ureide based silane coupling agents may be added as necessary.

In the underfill material 20 having this composition, a time for a reaction rate to reach 20% at 240° C. calculated by Ozawa method using a differential scanning calorimeter (DSC) is 2.0 sec or less and a time for the reaction rate to reach 60% is 3.0 sec or more. If the time for the reaction rate to reach 20% is more than 2.0 sec, voids will occur, while if the time for the reaction rate to reach 60% is less than 3.0 sec, excellent solder bonding properties will not be obtained.

In addition, preferable viscosity at the reaction rate of 20% is $0.2\times10^4$ Pa*s or more and preferable viscosity at the reaction rate of 60% is $500\times10^4$ Pa*s or less. A viscosity of less than $0.2 \times 10^4$ Pa*s at the reaction rate of 20% cannot eliminate voids and a viscosity of more than $500 \times 10^4$ Pa*s at the reaction rate of 60% cannot achieve excellent solder bonding properties.

In the DSC-Ozawa method, a reaction rate is calculated as follows. Firstly, based on data obtained by increasing temperature of samples at constant rates, heat quantity throughout the peak, peak temperature and rate of change to the peak top are calculated. Secondly, an Ozawa-plot is created, wherein the vertical axis represents common logarithm values of the rate of temperature increase and the horizontal axis represents reciprocal values of the peak temperature, to obtain activation energy, frequency factor and reaction order of the sample. Finally, by creating a reaction simulation chart on the basis of the activation energy, frequency factor and reaction order, a time to reach a predetermined reaction rate at a predetermined temperature can be calculated.

Next, a manufacturing method of a pre-applied underfill film wherein the aforementioned underfill material is formed into a film will be explained. An adhesive agent composition containing a film-forming resin, an epoxy resin, an acid anhydride, an acrylic resin and an organic peroxide is dissolved in a solvent. Toluene and ethyl acetate, among others, or a mixture of these may be used as the solvent. The prepared epoxy composition is applied to a detachable substrate material with a bar coater or other applicator.

The detachable substrate material, which has, for example, a layered structure including a release agent such as silicone, coated to a PET (poly ethylene terephthalate), OPP (oriented polypropylene), PMP (poly-4-methylpentene-1), or PTFE (polytetrafluoroethylene) material, maintains the shape of the composition, and prevents the composition from drying, Next, the epoxy composition, having been applied to the detachable substrate material, is dried by placing it into an oven or a heating and drying device, among others. Thus, a pre-applied underfill film of a predetermined thickness can be obtained.

2. Method for Manufacturing Semiconductor Device

Next, a method for manufacturing semiconductor device using the aforementioned pre-applied underfill film will be explained.

Figure 4:
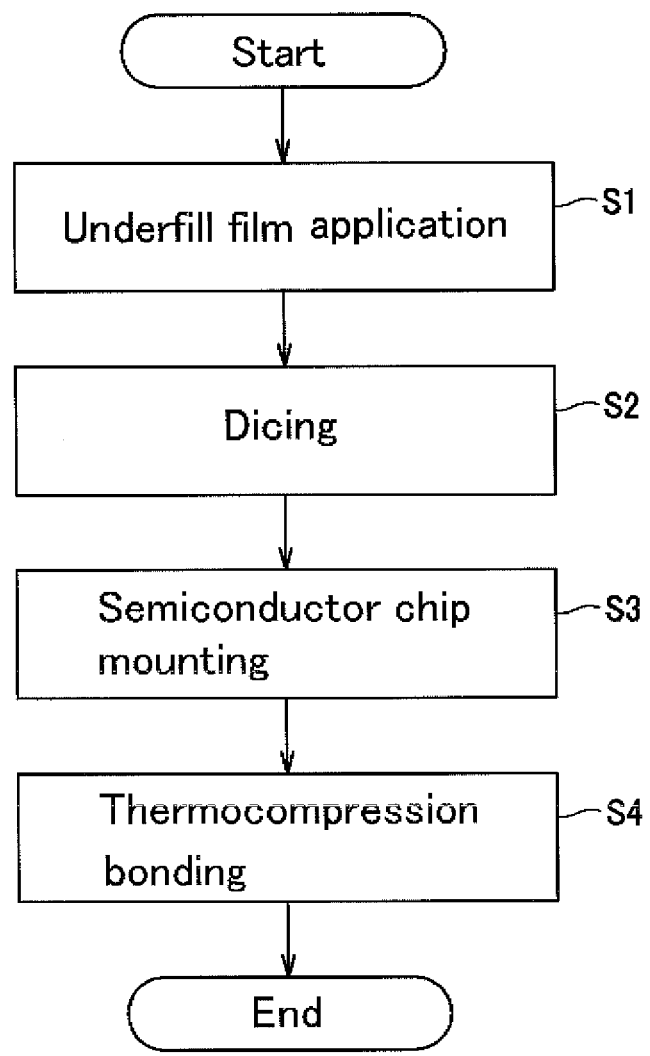
FIG. 4 is a flowchart showing a method for manufacturing a semiconductor device according to an embodiment of this invention.

FIG. 4 is a flowchart illustrating a method for manufacturing the semiconductor device according to this embodiment. As illustrated in FIG. 4, the method for manufacturing the semiconductor device according to this embodiment includes an underfill film application step S1, a dicing step S2, a semiconductor chip mounting step S3, and a thermocompression bonding step S4.

Figure 5:
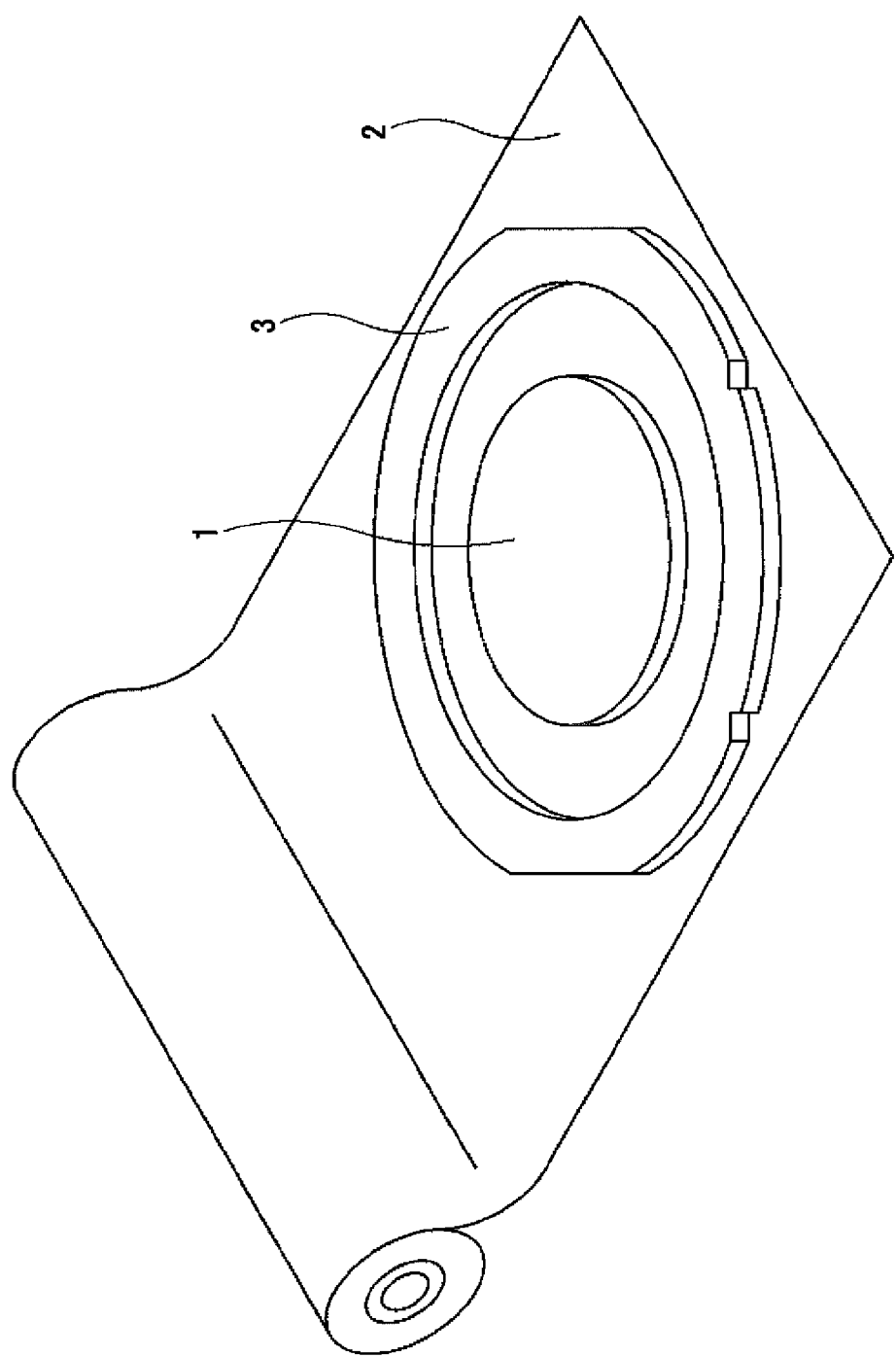
FIG. 5 is a schematic perspective view illustrating a step of applying an underfill film onto a wafer.

FIG. 5 is a schematic perspective view illustrating the step of applying the underfill film onto a wafer. As illustrated in FIG. 5, in the application step S1, a wafer 1 is secured by a jig 3 having a diameter larger than the wafer 1 and having a ring shaped or other enclosing shaped frame, and an underfill film 2 is applied onto the wafer 1. The underfill film 2 protects and secures the position of the wafer 1 during dicing and functions as a dicing tape that retains the wafer 1 during pick-up. It should be noted that a number of ICs (Integrated Circuits) are manufactured on the wafer 1; each of the semiconductor chips 10, demarked by a scribe line on the bonding side of the wafer 1, has a solder-tipped electrode(s) as shown in FIG. 1.

Figure 6:
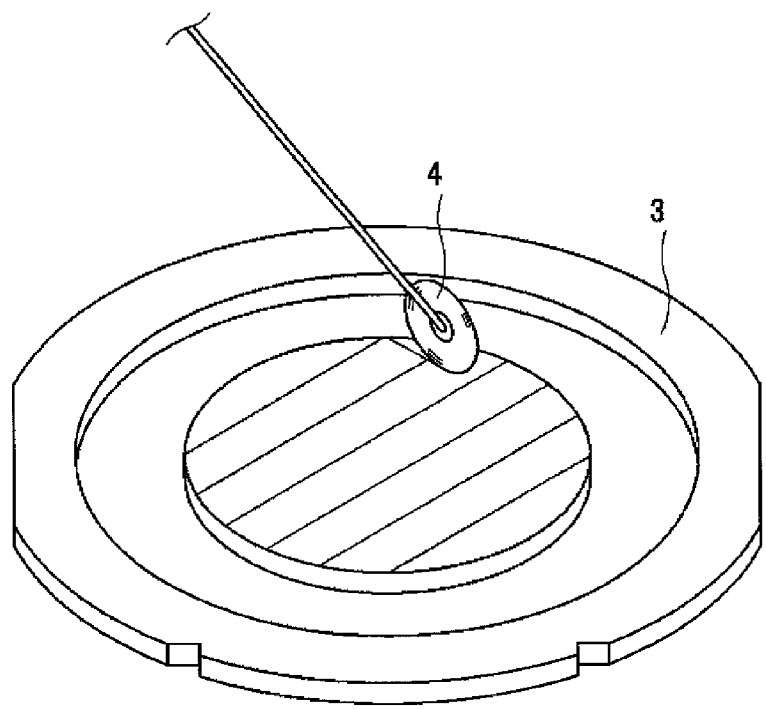
FIG. 6 is a schematic perspective view illustrating a wafer-dicing step.

FIG. 6 is a schematic perspective view illustrating the wafer-dicing step. As shown in FIG. 6, in the dicing step S2, a blade 4 is pressed along scribe lines thereby cutting the wafer 1 and the individual semiconductor chips are separated.

Figure 7:
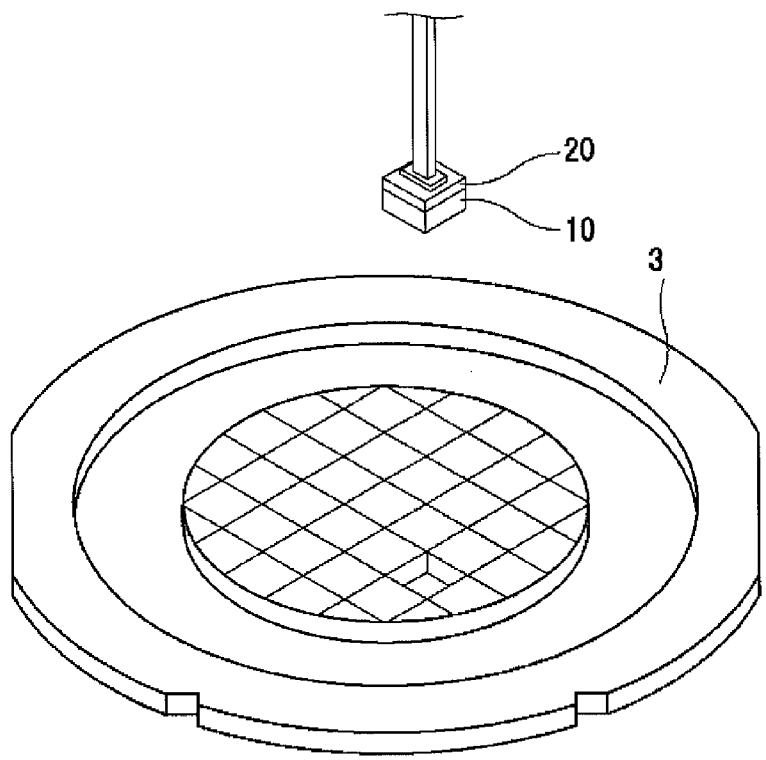
FIG. 7 is a schematic perspective view illustrating a pick-up step of a semiconductor chip.

FIG. 7 is a schematic perspective view illustrating the pick-up step of the semiconductor chip. As shown in FIG. 7, each of the semiconductor chips 10, having an underfill film, is retained by the underfill film during the pick-up.

As illustrated in FIG. 2, in the semiconductor chip mounting step S3, the semiconductor chip 10 is mounted on the circuit substrate 30 via the underfill film. Additionally, the semiconductor chip 10 with underfill film is aligned so that the solder-tipped electrode opposes the counter electrode 32. Thereafter, thermocompression bonding is performed under predetermined conditions of temperature, pressure, and duration such that the underfill film is made flowable but not completely cured, and mounting is performed.

The temperature condition during mounting is preferably in a range of 30° C. to 155° C. Additionally, the pressure is preferably 50 N or less and more preferably 40 N or less. Additionally, the duration is preferably in a range of 0.1 sec to 10 sec and more preferably in a range of 0.1 sec to 1.0 sec. Thus, the solder-tipped electrode(s) can contact the electrode(s) of the circuit substrate 30 without melting the solder-tipped electrode(s) and the underfill film can be in a state of not being completely cured. Additionally, this fixation at a low temperature can suppress generation of voids and reduce damage to the semiconductor chip 10.

In the thermocompression bonding step S4, under the condition of raising temperature at a predetermined rate from a first temperature to a second temperature, the solder of the solder-tipped electrode is melted to form a metallic bond and the underfill film is completely cured.

The first temperature is preferably the same or nearly the same as the minimum melt viscosity attainment temperature of the underfill material and preferably in the range of 50° C. to 150° C. In this manner, curing behavior of the underfill material can be made suitable to the bonding condition and generation of voids can be suppressed.

Additionally, the rate of temperature rise is preferably in a range of 50° C./sec to 150° C./sec. Additionally, the second temperature is preferably in a range of 200° C. to 280° C. and more preferably in a range of 220° C. to 260° C., depending on the type of solder. Under these conditions, a metallic bond is formed between the solder-tipped electrode and the substrate electrode, the underfill film is completely cured, and the electrodes of the semiconductor chip 10 are electrically and mechanically connected to the electrodes of the circuit substrate 30.

Additionally, in the thermocompression bonding step S4, a height of a bonder head is maintained by the elasticity of resin until the temperature reaches the point at which the mounted underfill film starts to melt; due to resin melting in accordance with temperature rise, the bonder head rapidly descends to a lowest position. The lowest position is determined by a relation between descent speed of the bonder head and resin curing speed. After further resin curing, the height of the bonder head is gradually increased due to thermal expansion of the resin and the bonder head. In this manner, by causing the bonder head to descend to the lowest position during the temperature rise from the first temperature to the second temperature, generation of voids that occur because of resin melting can be suppressed.

As explained hereinabove, the method for manufacturing the semiconductor device in this embodiment can achieve voidless packaging and excellent solder bonding properties by applying the underfill material 20 onto a semiconductor chip 10, on which a solder-tipped electrode has been formed, because the underfill material contains an epoxy resin and a curing agent, and because the time for the reaction rate to reach 20% at 240° C. calculated by Ozawa method using a differential scanning calorimeter is 2.0 sec or less and the time for the reaction rate to reach 60% is 3.0 sec or more.

It should be noted that in the embodiment described above, the underfill film functioned as a dicing tape; however, flip chip packaging may be performed using a mounting method in which another dicing tape is used and the underfill film is used after dicing.

Other Embodiments

In the hereinabove mentioned techniques, by filling pores formed on the semiconductor chip with a metal material, TSV (Through Silicon Via) techniques can be applied wherein more than one layered chip substrates in a sandwiched configuration are electrically connected.

These techniques may be applied to a method for manufacturing semiconductor device having more than one chip substrate layers comprising a first surface having a solder-tipped electrode formed thereon and, opposite to the first surface, a second surface having a counter electrode formed thereon being opposite to the solder-tipped electrode.

In this case, with the underfill film applied to a first surface side of a first chip substrate, the first surface of the first chip substrate is mounted to a second surface of a second chip substrate. Then the first surface of the first chip substrate and the second surface of the second substrate are thermally compressed at a temperature above the melting point of the solder of the solder-tipped electrode to obtain a semiconductor device with more than one layer of chip substrates can be obtained.

3. Examples

Examples of the present invention will be explained below. In these examples, pre-applied underfill films were manufactured, times to reach predetermined reaction rates were calculated by DSC-Ozawa method, and viscosities at the predetermined reaction rates were calculated. A package body was manufactured by connecting a first IC chip having a solder-tipped electrode to a second IC chip having a counter electrode by using the underfill film, and voids and solder bonding properties thereof were evaluated. It should be noted that the present invention is not limited by these examples.

Package body manufacturing, calculation of the time to reach the predetermined reaction rate, calculation of the viscosity at the predetermined reaction rate, void evaluation, and solder bonding properties evaluation were performed in the following manner.

Manufacturing of Package Bodies

The underfill film was applied to the wafer by using a press machine under conditions of 50° C. and 0.5 Mpa and the wafer was diced to obtain a first IC chip having a solder-tipped electrode.

The first IC chip had a size of 7×7 mm, a thickness of 200 μm, and peripheral bumps (φ30 μm, 85 μm pitch, 280 pin) were formed thereon, each comprising a 10 μm thick Cu electrode with a 10 μm solder (Sn-3.5Ag, melting point: 221° C.) applied to the tip thereof.

Similarly, a second IC chip opposing the first IC chip had a size of 8×8 mm, a thickness of 100 μm and peripheral bumps (φ30 μm, 85 μm pitch, 280 pin) formed thereon, each comprising a 10 μm thick Cu electrode.

Then, the first IC chip was mounted onto the second IC chip by using a flip chip bonder under a condition of 60° C., 0.5 sec, and 30 N.

Subsequently, thermocompression bonding was conducted by using the flip chip bonder by increasing temperature from 60° C. to 250° C. for 10 sec. Furthermore, curing was performed under a condition of 150° C. for 2 hours to obtain a package body. It should be noted that the actual temperatures of the samples were measured with a thermocouple during use of the flip chip bonder.

Calculation of the Time to Reach a Predetermined Reaction Rate

Calculation of the time to reach a predetermined reaction rate was performed in the following manner.

(1) By using a differential scanning calorimeter (DSC) in accordance with the software manual attached to this device, based on data obtained by increasing temperature of samples at constant rates (temperature-increase rates of 5° C./min, 10° C./min and 20° C./min), total heat quantity throughout the peak, peak temperature, and rate of change to the peak top were calculated. The rate of change is the value of heat quantity to the peak temperature divided by total heat quantity throughout the peak.

(2) Ozawa-plots were created, wherein the vertical axis represents common logarithm values of the rate of temperature increase and the horizontal axis represents reciprocal values of the peak temperature, to obtain activation energy, frequency factor and reaction order of the sample.

(3) By creating a reaction simulation chart on the basis of the activation energy, frequency factor and reaction order obtained in (2), times for reaction rates to reach 20% and 60% were calculated.

Calculation of the Viscosity at the Predetermined Reaction Rate

Melt viscosity of each underfill film was measured by a rheometer (ARES, TA Instruments) under conditions of 5° C./min and 1 Hz. In addition, by using a differential scanning calorimeter (DSC), total heat quantity throughout the peak, peak temperature, and rate of change to the peak top were calculated under a condition of 5° C./min. The rate of change is the value of heat quantity to the peak temperature divided by total heat quantity throughout the peak. The temperature corresponding to the reaction rate of 20% and the temperature corresponding to the reaction rate of 60% were obtained from DSC data and melt viscosities corresponding to these temperatures were obtained from rheometer data to obtain melt viscosities corresponding to the reaction rates of 20% and 60%.

Evaluation of Voids

Each of the packages was observed by using an SAT (Scanning Acoustic Tomography), and cases in which area of voids was 5% or less of the total IC chip area were evaluated as "good" (represented as G, in Table 1) and cases in which voids area is more than 5% of the total IC chip area were evaluated as "bad" (represented as B, in Table 1).

Evaluation of Solder Bonding Properties

Each of the packages was cut and the cut section was polished, and state of the solder between the IC chip electrodes and the IC substrate electrodes was observed by using an SEM (Scanning Electron Microscope). Cases having no bond interface of solder were evaluated as good (G) and cases having a bond interface with resin entering between solder bumps were evaluated as bad (B).

Example 1

As shown in Table 1, a resin composition for an underfill film was prepared by blending an acrylic rubber polymer (Teisan Resin SG-P3, Nagase chemteX Corporation) at 5.0 pts. mass, a phenoxy resin (PKHH, Union Carbide Corporation) at 10.0 pts. mass, an epoxy resin (HP7200H, DIC Corporation) at 15.0 pts. mass, an acid anhydride (MH-700, New Japan Chemical Co., Ltd.) at 9.0 pts. mass, an imidazole (2MZ-A, SHIKOKU CHEMICALS CORPORATION) at 0.3 pts. mass, an acrylic resin (DCP, Shin Nakamura Chemical Co., Ltd.) at 24.0 pts. mass, an initiator (PERBUTYL Z, NOF CORPORATION) at 0.3 pts. mass, a filler A (SO-E5, Admatechs Company Limited) at 31.5 pts. mass and a filler B (AEROSIL RY200, NIPPON AEROSIL CO., LTD) at 5.0 pts. mass. This composition was applied to a PET (polyethylene terephthalate) material treated to be detachable by using a bar coater and dried in an oven under conditions of 80° C. for 3 min to manufacture the underfill film, having a thickness of 40 μm (detachable cover PET (25 μm)/underfill film (40 μm)/detachable base PET (50 μm)).

Figure 8:
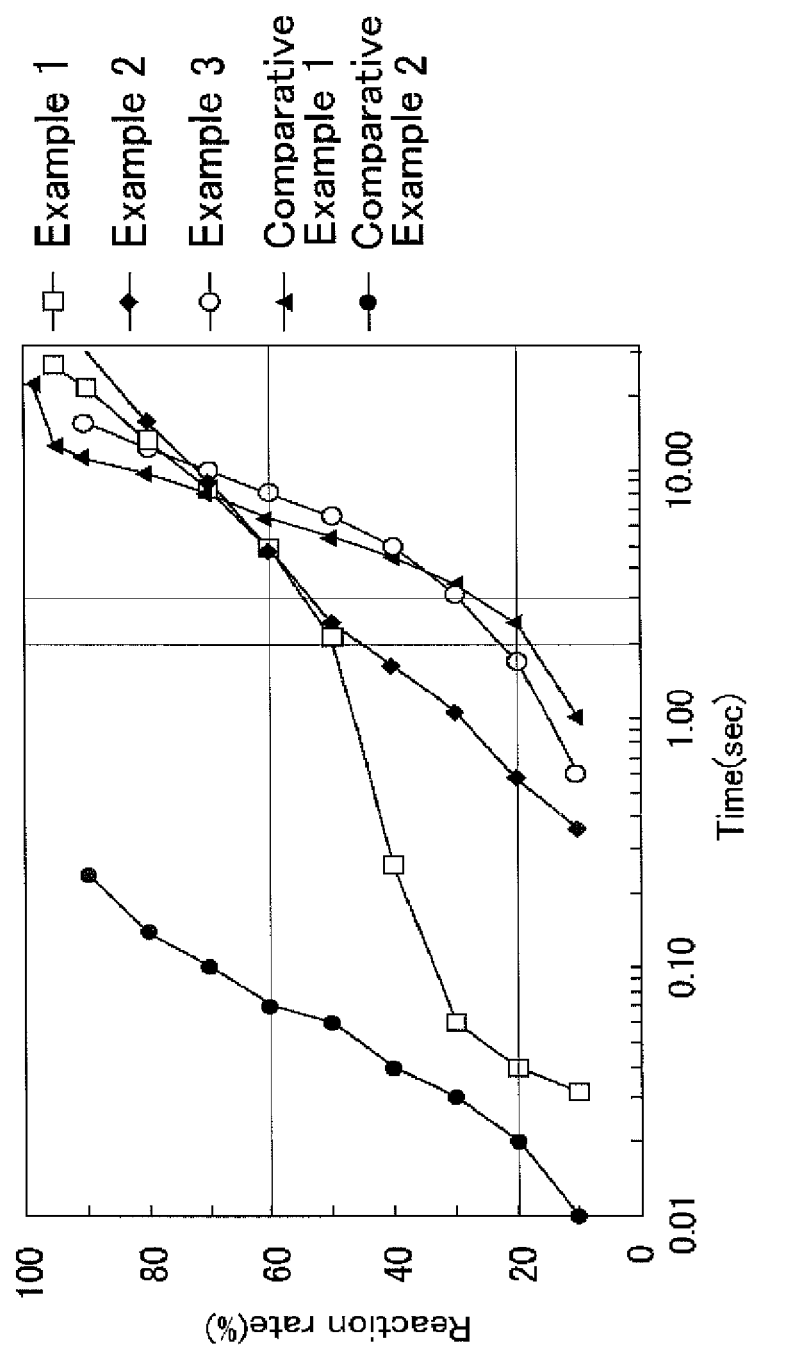
FIG. 8 is a graph showing reaction time versus reaction rate of an underfill film calculated by DSC-Ozawa method.

As shown in FIG. 8, in the underfill film of Example 1, the time for reaction rates to reach 20% was 0.04 sec and the time for reaction rates to reach 60% was 4.83 sec. The melt viscosity at the reaction rate of 20% was 5.5E+04 Pa*s and the melt viscosity at the reaction rate of 60% was 1.8E+06 Pa*s. Additionally, voids were evaluated as good (G) and solder bonding was also evaluated as good (G).

Example 2

As shown in Table 1, a resin composition for an underfill film was prepared by blending an acrylic rubber polymer (Teisan Resin SG-P3, Nagase chemteX Corporation) at 5.0 pts. mass, a phenoxy resin (PKHH, Union Carbide Corporation) at 10.0 pts. mass, an epoxy resin (HP7200H, DIC Corporation) at 47.5 pts. mass, an imidazole (2MZ-A, SHIKOKU CHEMICALS CORPORATION) at 1.0 pts. mass, a filler A (SO-E5, Admatechs Company Limited) at 31.5 pts. mass and a filler B (AEROSIL RY200, NIPPON AEROSIL CO., LTD) at 5.0 pts. mass. This composition was applied to a PET (polyethylene terephthalate) material treated to be detachable by using a bar coater and dried in an oven under conditions of 80° C. for 3 min to manufacture the underfill film, having a thickness of 40 μm (detachable cover PET (25 μm)/underfill film (40 μm)/detachable base PET (50 μm)).

As shown in FIG. 8, in the underfill film of Example 2, the time for reaction rates to reach 20% was 0.58 sec and the time for reaction rates to reach 60% was 4.80 sec. The melt viscosity at the reaction rate of 20% was 5.6E+04 Pa*s and the melt viscosity at the reaction rate of 60% was 1.4E+06 Pa*s. Additionally, voids were evaluated as good (G) and solder bonding was also evaluated as good (G).

Example 3

As shown in Table 1, a resin composition for an underfill film was prepared by blending an acrylic rubber polymer (Teisan Resin SG-P3, Nagase chemteX Corporation) at 5.0 pts. mass, a phenoxy resin (PKHH, Union Carbide Corporation) at 10.0 pts. mass, an epoxy resin (HP7200H, DIC Corporation) at 27.0 pts. mass, an acid anhydride (MH-700, New Japan Chemical Co., Ltd.) at 16.2 pts. mass, an imidazole (2MZ-A, SHIKOKU CHEMICALS CORPORATION) at 0.5 pts. mass, an acrylic resin (DCP, Shin Nakamura Chemical Co., Ltd.) at 4.8 pts. mass, an initiator (PERBUTYL Z, NOF CORPORATION) at 0.1 pts. mass, a filler A (SO-E5, Admatechs Company Limited) at 31.5 pts. mass and a filler B (AEROSIL RY200, NIPPON AEROSIL CO., LTD) at 5.0 pts. mass. This composition was applied to a PET (polyethylene terephthalate) material treated to be detachable by using a bar coater and dried in an oven under conditions of 80° C. for 3 min to manufacture the underfill film, having a thickness of 40 μm (detachable cover PET (25 μm)/underfill film (40 μm)/detachable base PET (50 μm)).

As shown in FIG. 8, in the underfill film of Example 3, the time for the reaction rate to reach 20% was 1.71 sec and the time for the reaction rate to reach 60% was 8.18 sec. The melt viscosity at the reaction rate of 20% was 6.3E+04 Pa*s and the melt viscosity at the reaction rate of 60% was 1.6E+06 Pa*s. Additionally, voids were evaluated as good (G) and solder bonding was also evaluated as good (G).

Comparative Example 1

As shown in Table 1, a resin composition for an underfill film was prepared by blending an acrylic rubber polymer (Teisan Resin SG-P3, Nagase chemteX Corporation) at 5.0 pts. mass, a phenoxy resin (PKHH, Union Carbide Corporation) at 10.0 pts. mass, an epoxy resin (HP7200H, DIC Corporation) at 30.0 pts. mass, an acid anhydride (MH-700, New Japan Chemical Co., Ltd.) at 18.0 pts. mass, an imidazole (2MZ-A, SHIKOKU CHEMICALS CORPORATION) at 0.5 pts. mass, a filler A (SO-E5, Admatechs Company Limited) at 31.5 pts. mass and a filler B (AEROSIL RY200, NIPPON AEROSIL CO., LTD) at 5.0 pts. mass. This composition was applied to a PET (polyethylene terephthalate) material treated to be detachable by using a bar coater and dried in an oven under conditions of 80° C. for 3 min to manufacture the underfill film, having a thickness of 40 μm (detachable cover PET (25 μm)/underfill film (40 μm)/detachable base PET (50 μm)).

As shown in FIG. 8, in the underfill film of Comparative Example 1, the time for the reaction rate to reach 20% was 2.45 sec and the time for the reaction rate to reach 60% was 6.48 sec. The melt viscosity at the reaction rate of 20% was 1.0E+03 Pa*s and the melt viscosity at the reaction rate of 60% was 2.3E+05 Pa*s. Additionally, voids were evaluated as bad (B) and solder bonding was evaluated as good (G).

Comparative Example 1

As shown in Table 1, a resin composition for an underfill film was prepared by blending an acrylic rubber polymer (Teisan Resin SG-P3, Nagase chemteX Corporation) at 5.0 pts. mass, a phenoxy resin Union Carbide Corporation) at 10.0 pts. mass, an acrylic resin (DCP, Shin Nakamura Chemical Co., Ltd.) at 48.0 pts. mass, an initiator (PERBUTYL Z, NOF CORPORATION) at 0.5 pts. mass, a filler A (SO-E5, Admatechs Company Limited) at 31.5 pts. mass and a filler B (AEROSIL RY200, NIPPON AEROSIL CO., LTD) at 5.0 pts. mass. This composition was applied to a PET (polyethylene terephthalate) material treated to be detachable by using a bar coater and dried in an oven under conditions of 80° C. for 3 min to manufacture the underfill film, having a thickness of 40 μm (detachable cover PET (25 μm)/underfill film (40 μm)/detachable base PET (50 μm)).

As shown in FIG. 8, in the underfill film of Comparative Example 2, the time for reaction rates to reach 20% was 0.02 sec and the time for reaction rates to reach 60% was 0.07 sec. The melt viscosity at the reaction rate of 20% was 1.1E+06 Pa*s and the melt viscosity at the reaction rate of 60% was 1.0E+07 Pa*s. Additionally, voids were evaluated as good (G) and solder bonding was evaluated as bad (B).

TABLE 1

| Classification | Product Name | Ex. 1 | Ex. 2 | Ex. 3 | Com. 1 | Com. 2 |
|---|---|---|---|---|---|---|
| Film forming resin | SG-80H | 5.0 | 5.0 | 5.0 | 5.0 | 5.0 |
| | PKHH | 10.0 | 10.0 | 10.0 | 10.0 | 10.0 |
| Epoxy resin | HP2700 | 15.0 | 47.5 | 27.0 | 30.0 | — |
| Curing agent | Acid anhydride (MH-700) | 9.0 | — | 16.2 | 18.0 | — |
| Curing accelerator | Imidazole (2MZ-A) | 0.3 | 1.0 | 0.5 | 0.5 | — |
| Acrylic resin | DCP-A | 24.0 | — | 4.8 | — | 48.0 |

TABLE 1-continued

| Classification | Product Name | Ex. 1 | Ex. 2 | Ex. 3 | Com. 1 | Com. 2 |
|---|---|---|---|---|---|---|
| Initiator | PERBUTYL Z | 0.3 | — | 0.1 | — | 0.5 |
| Filler | SO-E5 | 31.5 | 31.5 | 31.5 | 31.5 | 31.5 |
|  | AEROSIL RY200 | 5.0 | 5.0 | 5.0 | 5.0 | 5.0 |
|  | Total | 100 | 100 | 100 | 100 | 100 |
| Time to reach 20% reaction rate [sec] |  | 0.04 | 0.58 | 1.71 | 2.45 | 0.02 |
| Time to reach 60% reaction rate [sec] |  | 4.83 | 4.80 | 8.18 | 6.48 | 0.07 |
| Melt viscosity at 20% reaction rate [Pa * s] |  | 5.50E+04 | 5.60E+04 | 6.30E+04 | 1.00E+03 | 1.10E+06 |
| Melt viscosity at 60% reaction rate [Pa * s] |  | 1.80E+06 | 1.40E+06 | 1.60E+06 | 2.30E+05 | 1E+07 or more |
| Void evaluation |  | G | G | G | B | G |
| Solder bonding state evaluation |  | G | G | G | G | B |

In Comparative Example 1, voids occurred because the time for the reaction rate to reach 20% exceeded 2.0 sec. Additionally, in Comparative Example 1, the voids were not eliminated since the viscosity at the reaction rate of 20% was less than $0.2 \times 10^4$ Pa*s.

In Comparative Example 2, excellent solder bonding properties were not achieved because the time for the reaction rate to reach 60% was less than 3.0 sec. Additionally, in Comparative Example 2, excellent solder bonding properties were not achieved since the viscosity at the reaction rate of 60% exceeds $500 \times 10^4$ Pa*s.

On the contrary, in Examples 1 to 3, voidless packaging and excellent solder connection properties were achieved because the times for the reaction rate to reach 20% at 240° C. were 2.0 sec or less and the times for the reaction rate to reach 60% were 3.0 sec or more.

REFERENCE SIGNS LIST

1 wafer, 2 underfill film, 3 jig, 4 blade, 10 semiconductor chip, 11 semiconductor, 12 electrode, 13 solder, 20 underfill material, 21 first adhesive layer, 22 second adhesive layer, 30 circuit substrate, 31 substrate material, 32 counter electrode

The invention claimed is:

1. A method for manufacturing a semiconductor device comprising:

a mounting step of mounting a semiconductor chip onto an electronic component, the semiconductor chip having a solder-tipped electrode formed thereon and an underfill material applied to the surface of the solder-tipped electrode, and the electronic component having a counter electrode facing the solder-tipped electrode, and a thermocompression bonding step of thermally compressing the semiconductor chip and the electronic component, wherein the underfill material contains a phenoxy resin, an epoxy resin, a curing agent, a (meth)acrylate resin and an organic peroxide, and a time for a reaction rate to reach 20% at 240° C. calculated by Ozawa method using a differential scanning calorimeter is 2.0 sec or less and a time for the reaction rate to reach 60% is 3.0 sec or more.

2. The method for manufacturing a semiconductor device according to claim 1 further comprising an applying step of applying an underfill film onto a wafer.

3. The method for manufacturing a semiconductor device according to claim 1, wherein the thermocompression bonding step is performed under a condition where the temperature is increased from a first temperature to a second temperature, the increase in temperature occurring at a rate in a range of 50° C./sec to 150° C./sec.

4. The method for manufacturing a semiconductor device according to claim 1, wherein the underfill material contains a viscosity at the reaction rate of 20% is $0.2 \times 10^4$ Pa*s or more and a viscosity at the reaction rate of 60% is $500 \times 10^4$ Pa*s or less.

5. The method for manufacturing a semiconductor device according to claim 1, wherein the (meth)acrylate resin is a bifunctional (meth)acrylate, and the organic peroxide is a peroxy ester.

* * * * *